United States Patent [19]

Chang et al.

[11] Patent Number: 4,639,919
[45] Date of Patent: Jan. 27, 1987

[54] DISTRIBUTED PATTERN GENERATOR

[75] Inventors: Yi-Hua E. Chang, Poughkeepsie; Algirdas J. Gruodis, Wappingers Falls; Hans P. Muhlfeld, Jr., Highland, all of N.Y.; Charles W. Rodriguez, Bethel, Conn.; Mark L. Shulman, Hyde Park, N.Y.

[73] Assignee: International Business Machines Corporation, Armonk, N.Y.

[21] Appl. No.: 564,853

[22] Filed: Dec. 19, 1983

[51] Int. Cl.[4] .............................................. G01R 31/28
[52] U.S. Cl. .................................... 371/27; 324/73 R; 371/20
[58] Field of Search ....................... 371/20, 21, 25, 27; 324/73 R, 73 AT

[56] References Cited

U.S. PATENT DOCUMENTS

| Re. 31,056 | 10/1982 | Chau et al. | 324/73 R |
|---|---|---|---|
| 3,772,595 | 11/1973 | De Wolf et al. | 324/73 R |
| 4,195,770 | 4/1980 | Benton et al. | 371/21 |
| 4,293,950 | 10/1981 | Shimizu et al. | 371/21 |
| 4,312,067 | 1/1982 | Shirasaka | 371/25 |
| 4,369,511 | 1/1983 | Kimura et al. | 371/21 |
| 4,370,746 | 1/1983 | Jones et al. | 371/27 |
| 4,402,081 | 8/1983 | Ichimiya et al. | 371/21 |
| 4,493,045 | 1/1985 | Hughes, Jr. | 371/27 X |
| 4,493,079 | 1/1985 | Hughes, Jr. | 371/27 |
| 4,495,622 | 1/1985 | Charruau | 371/27 X |
| 4,517,661 | 5/1985 | Graf et al. | 371/27 X |

FOREIGN PATENT DOCUMENTS 0108255  5/1984  European Pat. Off. .

*Primary Examiner*—Charles E. Atkinson
*Attorney, Agent, or Firm*—Sughrue, Mion, Zinn, Macpeak and Seas

[57] ABSTRACT

An array testing apparatus includes a plurality of pin pattern generators for individually generating serial bit sequences required at each pin of a device under test during the testing operation. The individual pin pattern generators receive starting addresses from one or more programmable controllers and each pin pattern generator then performs a subroutine to repeat basic patterns or combinations of basic patterns as necessary. Both the pin pattern generators and the programmable controllers may include loop logic for obtaining the desired repetition sequences.

19 Claims, 8 Drawing Figures

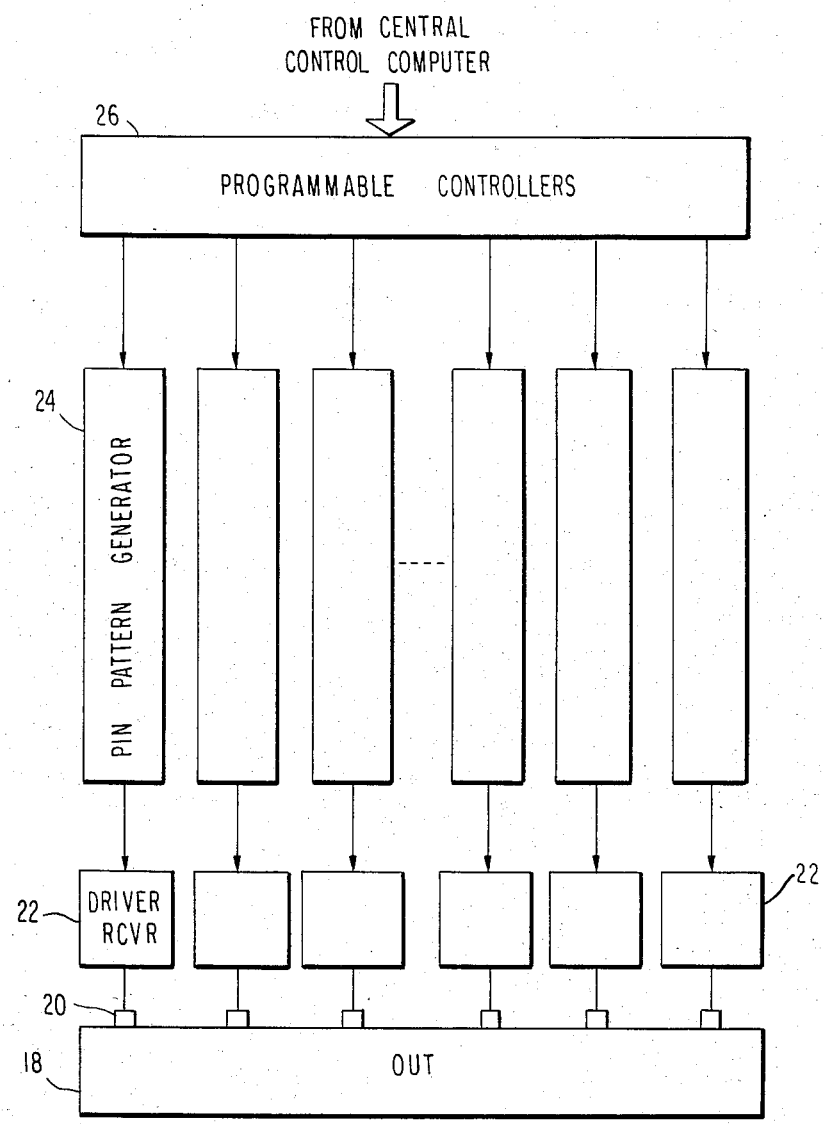

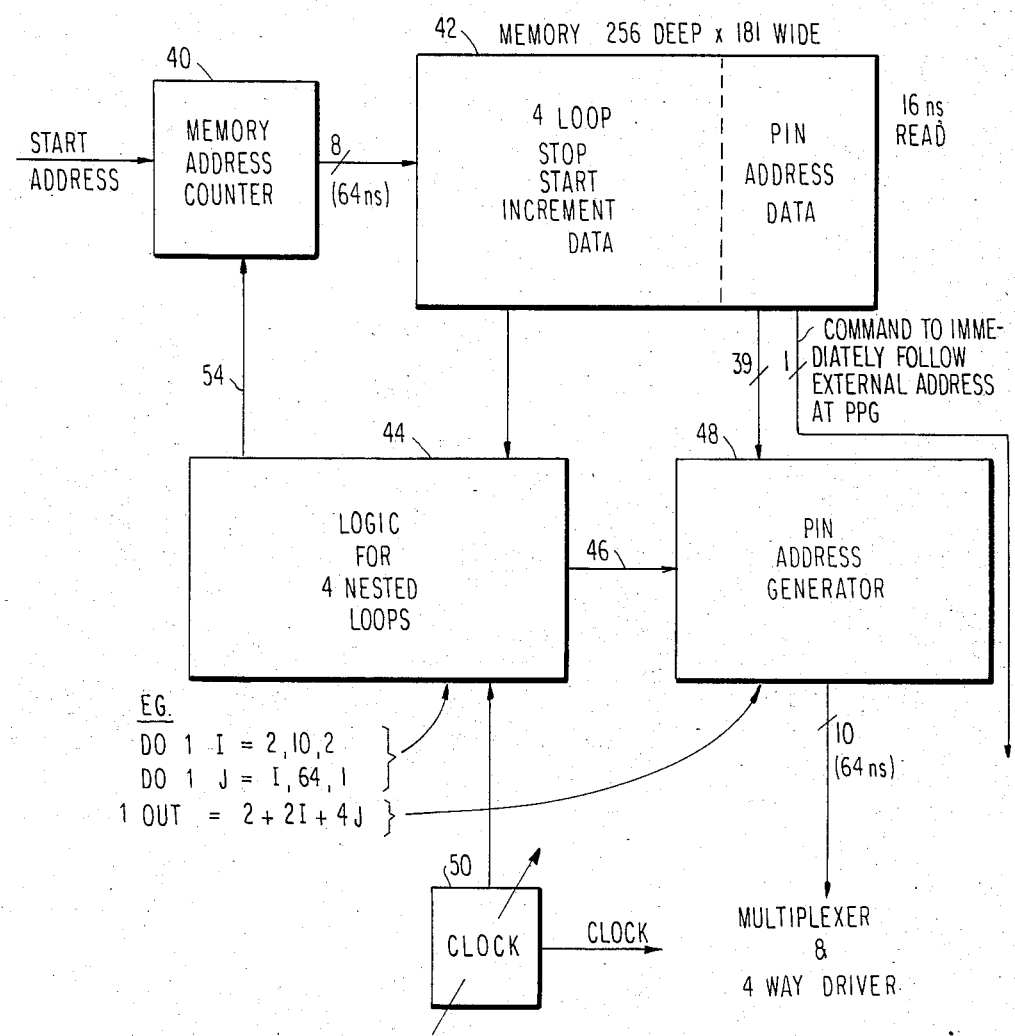

DISTRIBUTED PATTERN GENERATOR

BACKGROUND OF THE INVENTION

This invention relates to an apparatus for testing semiconductor devices and, more particularly, to such an apparatus which tests semiconductor devices by generating test vectors for application to input terminals of a device and examining the output response.

As semiconductor devices have become more and more complex, it has become increasingly difficult, yet increasingly important, to test the devices to ensure that they operate properly. In a typical semiconductor array tester, a test vector is applied to input terminals and the array output is monitored to see if the output is in agreement with the output that would be expected from a properly operating array. As a practical matter, in order to adequately test the full range of operations in an array, it is necessary to apply a long sequence of test vectors to the array and to monitor a correspondingly long sequence of outputs. If all outputs are in agreement with the expected outputs, the semiconductor array is operating properly. If one or more of the actual outputs differ from the expected values, the array outputs can be analyzed to determine the cause of the error. If the error cannot be corrected, the analysis of the failure data will be helpful in re-assessing manufacturing techniques in an attempt to reduce the number of failures.

Typical examples of testing arrangements are disclosed in the following references: U.S. Pat. No. 4,242,751 issued to Henckels et al; U.S. Pat. No. 4,108,358 issued to Niemaszyk et al; U.S. Pat. No. 3,614,608 issued to Giedd et al; U.S. Pat. No. 3,869,603 issued to Auspurg et al; U.S. Pat. No. 4,100,403 issued to Eggenberger et al; U.S. Pat. No. 4,335,457 issued to Early; U.S. Pat. No. 4,339,801 issued to Hosaka et al; U.S. Pat. No. 4,342,084 issued to Sager et al; U.S. Pat. No. 3,655,959 issued to Chernow et al.; and IBM Technical Disclosure Bulletin Vol. 19, No. 9, February, 1977, pages 3487-3488.

A typical testing arrangement may have a configuration such as shown in FIG. 1, wherein a memory 10 stores a complete vector sequence including address, data and control bits. Address generating circuitry, e.g. an address counter, in a central control computer (not shown) provides a sequence of addresses to the memory 10, and the memory 10 responds by reading out a sequence of words. Each word includes address, data and control fields, with the address field being provided to multiplexer 12, the data field being provided to multiplexer 14 and the control field being provided to the multiplexer 16. The memory chip under test, or Device Under Test (DUT), 18 includes a plurality of pins 20, and a pin electronics interface 22 includes one driver/receiver per pin. The multiplexer 12 will multiplex the address field, as appropriate, over all of the pins 20 via respective driver/receiver elements, and the multiplexers 14 and 16 will do likewise with the data and control fields.

The use of multiplexers 12, 14 and 16 allows the testing apparatus to adapt to various different pin configurations, thereby allowing the testing apparatus to be used in conjunction with a variety of different semiconductor chips. Other techniques for selectively connecting the test pattern bits to any of the DUT pins to enhance the versatility of the testing configuration are disclosed in the following references: U.S. Pat. No. 3,854,125 to Ehling et al; U.S. Pat. No. 4,216,539 to Raymond et al; U.S. Pat. No. 4,180,203 to Masters; U.S. Pat. No. 4,097,797 to Finet; U.S. Pat. No. 4,125,763 to Drabing et al; U.S. Pat. No. 4,070,565 to Borrelli; and U.S. Pat. No. 4,168,796 to Fulks et al.

A number of testing apparatus have been proposed in which the size of the pattern memory is reduced by generating at least a portion of the test pattern by some means other than the main test pattern memory. Examples of such testing systems are disclosed in the following references: U.S. Pat. No. 4,195,770 to Benton et al; U.S. Pat. No. 3,751,649 to Hart, Jr.; U.S. Pat. No. 4,313,200 to Nishiura; and IBM Technical Disclosure Bulletin Vol. 20, No. 2, July, 1977, pages 535-536.

Other miscellaneous testing arrangements are disclosed in U.S. Pat. No. 4,353,268 to Michel et al; U.S. Pat. No. 4,200,225 to Uneo et al; and U.S. Pat. No. 4,293,950 to Shimizu et al.

Despite the various improvements in the art, existing testing apparatus still suffer from a number of problems. As described by Wayne E. Sohl in "Selecting Test Patterns for 4K RAMS", IEEE Transactions on Manufacturing Technology, Vol. MFT-6, No. 3, September, 1977, pages 51-60, most test vector sequences require on the order of $N^2$ test vectors in order to properly test an array, where N is the memory size. In testing small memory arrays, the $N^2$ requirement is not a significant problem. However, in order to test a 64K memory array, the tester must provide in excess of $4 \times 10^9$ test vectors. This results in the requirement of an excessively large test pattern memory. A further problem is that, since a new test pattern memory vector must be read out for each test pattern step, the tester is inherently slow, e.g., 100 mHz maximum. This results in excessively long testing time requirements. Finally, the multiplexing enables the testing apparatus to accommodate various memory part numbers having different address, data or control pins, but the multiplexing is very slow, complex and expensive. Accordingly, it is necessary to limit the flexibility of the testing apparatus by dedicating certain pins for address, data or control bits.

The above problems in test pattern memory requirements and testing apparatus operating speed become even more significant as the size of semiconductor memory arrays increases. The requirements of existing testing devices will be intolerable when testing future generation semiconductor memories, e.g., 256K RAMS.

SUMMARY OF THE INVENTION

It is therefore an object of the present invention to provide an array testing apparatus which is capable of generating complex test patterns at high speed.

It is a further object of this invention to provide such a high speed testing apparatus while also maintaining flexibility and a capability of testing a wide range of devices.

It is a still further object of this invention to provide such a testing apparatus which does not require an excessively large pattern memory for storing long and complex test pattern sequences.

These and other objects are achieved according to the present invention by generating the desired test pattern on a per-pin basis. More particularly, when a Device Under Test (DUT) having a plurality of pins is tested, a long sequence of vectors is applied to the device, each vector including a plurality of bits for respective pins. For example, if a 256-pin DUT were to be tested, the testing apparatus may apply a sequence of 256-bit test vectors to the DUT. In a conventional testing apparatus, an N×256 memory may be used to store the sequence of N 256-bit test vectors, and the test vectors would then be generated from the pattern memory on a word-by-word basis. In the present invention, on the other hand, each pin is examined to determine the sequence of bits which will occur at that pin itself throughout the testing operation, and individual pin pattern generators are provided for separately generating the required bit sequence for each pin. For a testing apparatus capable of testing a DUT having up to 256 pins, 256 different pin pattern generators will be provided.

The individual pin pattern generators can provide their respective bit sequences at very high rates, thereby enabling testing to be carried out at e.g., 500 mHz. No multiplexers are required between the pattern generators and the pins. If each individual pin pattern generator were required to store its entire bit sequence, there would be substantially no savings in memory size, since the large test pattern memory required in conventional testing devices would merely be distributed to the individual pin pattern generators. However, since each pin pattern generator need only generate a serial bit stream, it is possible to examine the serial bit stream for repetitive patterns and to break down each serial bit pattern into a basic pattern (or a combination of basic patterns) that can be repeated in various combinations to generate the entire sequence for that pin. The pin pattern generator can then be programmed to repeat the basic pattern and basic pattern combinations an appropriate number of times to generate the required bit sequence.

In the preferred embodiment, the repetition of basic patterns and basic pattern combinations is accomplished by using a memory in the pin pattern generator to store the basic pattern and then using a sequence control means, e.g., DO loop logic, to control the sequence of read addresses provided to the pattern memory. In the example described herein, the pattern memory reads out a sequence of 32-bit words and the pin pattern data is then sent in parallel to the pin electronics four bits at a time, the pin electronics then performing a parallel-to-serial conversion before applying the bit sequence to the respective pin. In this way, the communications between the pattern generator and pin electronics can be carried out at a lower rate of 125 mHz, while the testing is conducted at 500 mHz.

Each pin pattern generator includes a control latch for storing an indication as to whether that pin pattern generator is to act as a driver or receiver. If the control latch information indicates the pin pattern generator is a driver, the bit sequence is shifted out to the pin electronics as described above. If the control latch indicates that the pin pattern generator is to act as a receiver, the data generated from the pattern memory comprises the mask data and expected data and is provided to an error detection logic for comparison with data received from the respective pin. The error data can then be stored in an error data memory and later shifted out to the central control computer.

The individual pin pattern generators operate under the control of a plurality of programmable controllers. A programmable controller responsible for the generation of address data to the DUT will generate a pin pattern address which is transmitted through multiplexers and I/O select circuitry to each of the pin pattern generators allocated for DUT address generation. This address will indicate the location in the pattern memory at which the first word of the pin pattern generator's "subroutine" is to begin. After completing its subroutine, i.e., its programmed repetition sequence, the pin pattern generator then responds to the next starting address provided from the programmable controller. Each programmable controller operates in a manner somewhat similar to the pin pattern generators in that it will also include a memory storing both data and repeat control bits at each memory location. The repeat control bit portion of the memory read-out will control the operation of a sequence controller, e.g., a DO loop logic circuit, to provide a desired sequence of "seed" addresses from the programmable controller.

Flexibility in testing a variety of devices is preserved, since the programmable controllers and pin pattern generators can all be programmed to provide any desired sequence of test vectors. The central control computer can store the necessary program for each different device to be tested, and the operator can then merely designate the part number of the device being tested and the central control computer will load the appropriate programming into the controllers, I/O select circuits and pin pattern generators.

BRIEF DESCRIPTION OF THE DRAWINGS

The invention will be more clearly understood from the following description in conjunction with the accompanying drawings, wherein:

FIG. 2 is a brief block diagram of the architecture of a testing apparatus according to the present invention;

FIG. 4 is a block diagram of a programmable controller illustrated in FIG. 3A;

DETAILED DESCRIPTION OF THE PREFERRED EMBODIMENT

Figure 1:
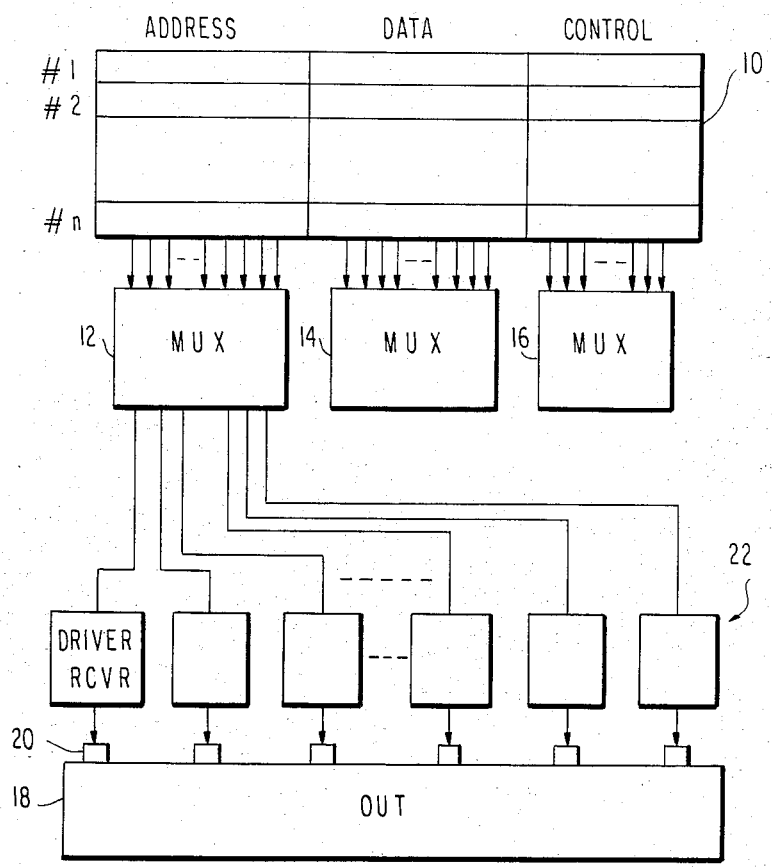
FIG. 1 is a brief block diagram of a conventional array testing apparatus.

FIG. 2 is a general illustration of the architecture of a distributed pattern generator according to the present invention. In the arrangement of FIG. 2, each pin 20 of the DUT 18 receives an input sequence through a respective driver/receiver 22 as in the conventional apparatus of FIG. 1. In the distributed pattern generator according to the present invention, however, there is no central test pattern memory from which the vector for all pins is read out as a single word. Instead, a plurality of pin pattern generators 24 are provided, with one pin pattern generator 24 being provided for each DUT pin. Each pin pattern generator 24 then generates its own bit sequence for its respective DUT pin.

When subjecting the DUT 18 to a complete cycle of test vectors, each pin can be examined individually to discern a pattern in the serial bit stream provided to each pin. This pattern can then be broken down into a word or number of words that can be repeated in various combinations to generate the entire sequence for that pin. Each pin pattern generator 24 is then loaded with the words which can be used to make up its bit sequence, and each generator 24 is also loaded with information for controlling the pin pattern repetition sequence. The output of each pin pattern generator is hardwired to a respective driver/receiver 22 for providing a serial bit pattern to the corresponding pin 20. The particular bit pattern to be provided by each pin pattern generator 24 can be controlled by one of a plurality of programmable controllers 26.

Figure 3A:
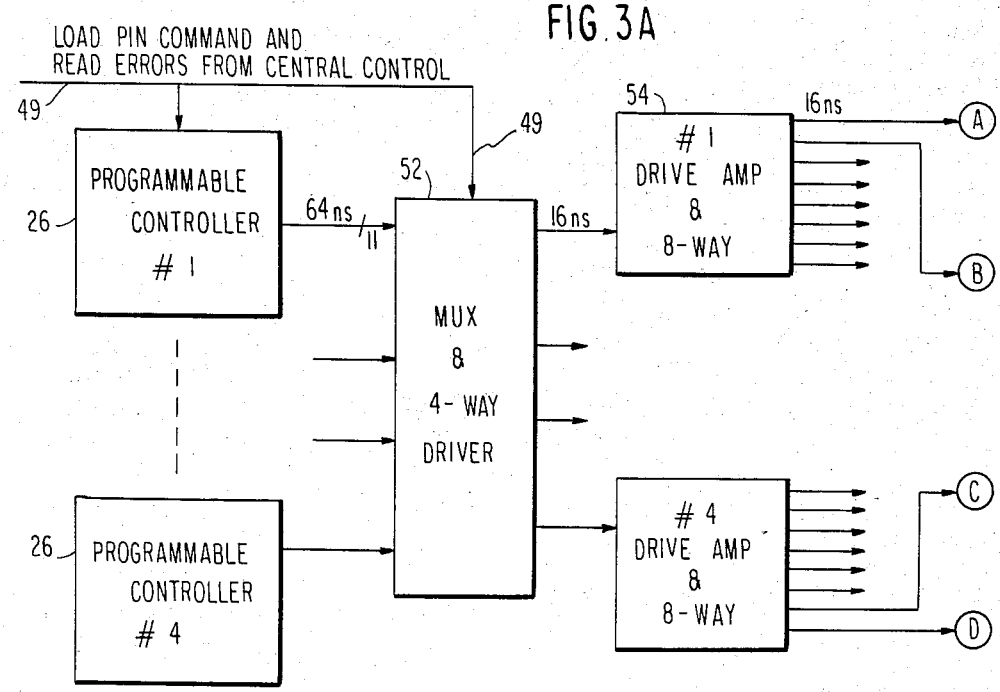
FIGS. 3A–3C collectively form a block diagram of a testing apparatus according to the present invention.
Figure 3B:
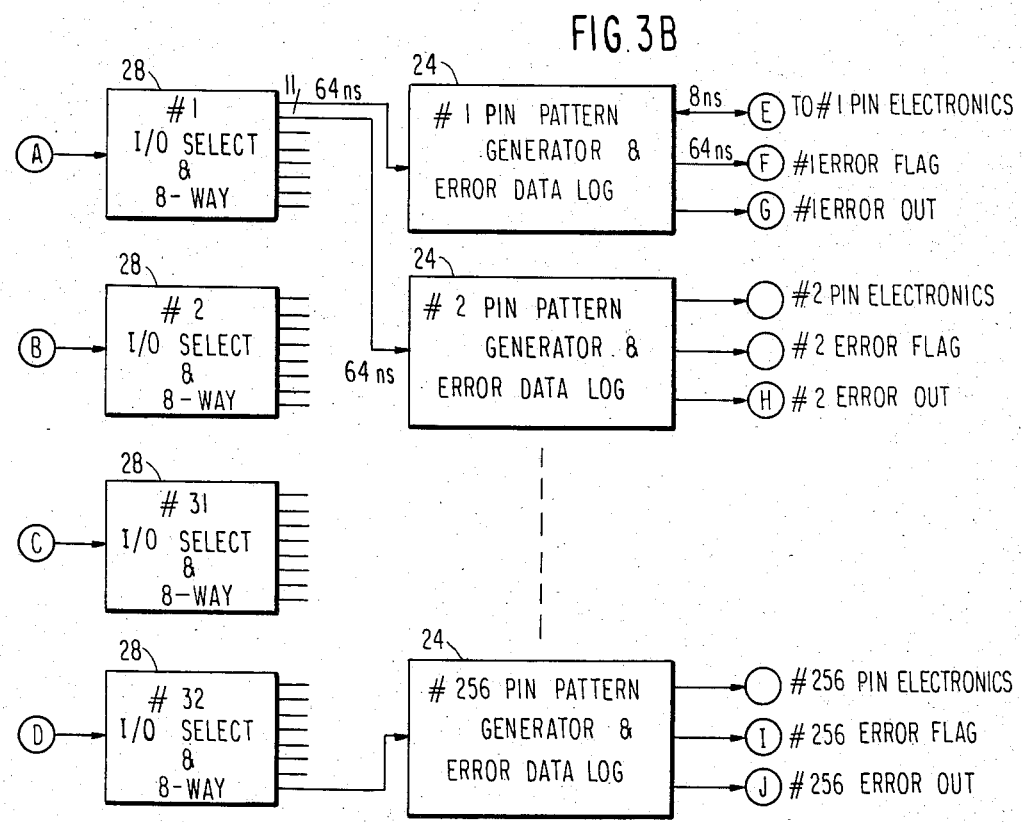
Figure 3C:
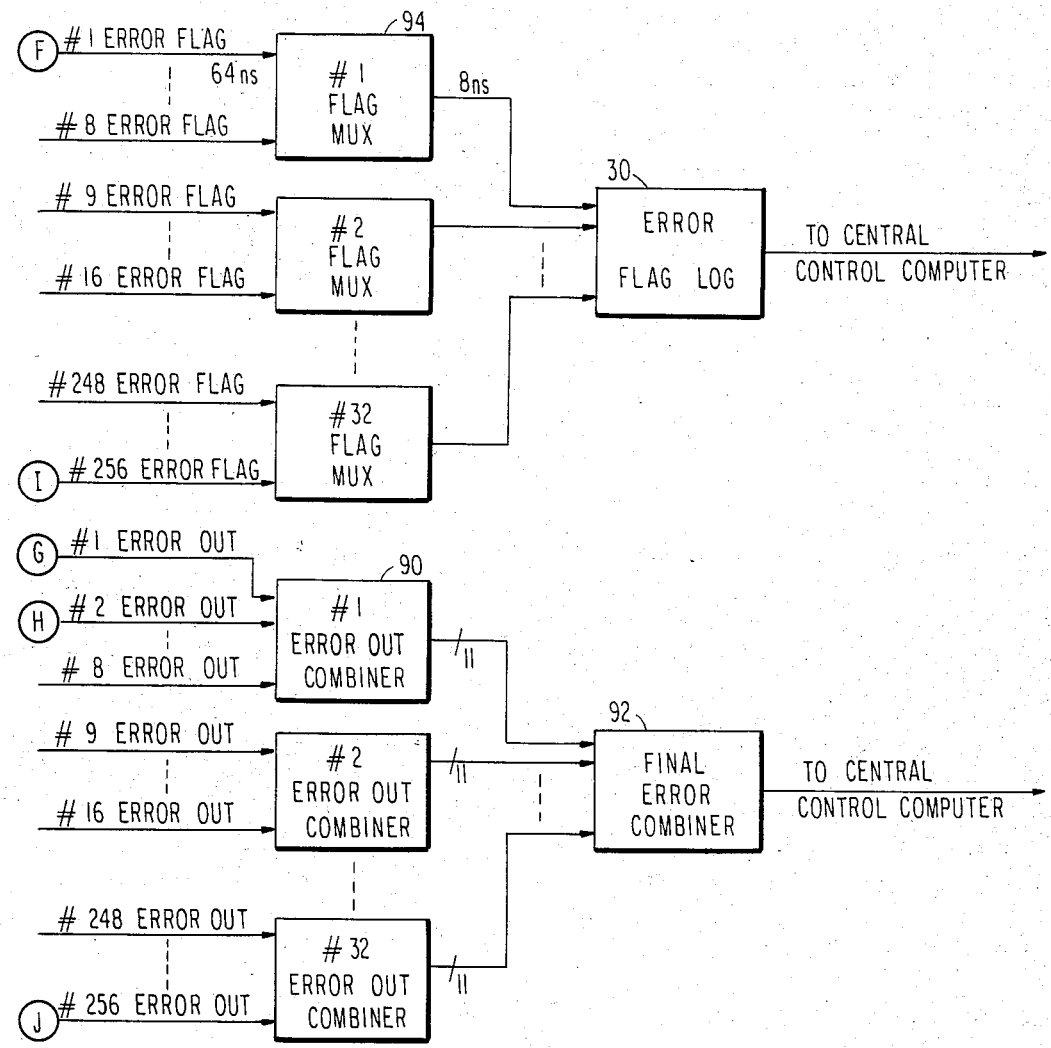

FIGS. 3A–3C illustrate in more detail a block diagram of the distributed pattern generator according to the present invention. It should be noted, however, that the preferred embodiment described herein is given by way of example only. The system illustrated in FIGS. 3A–3C includes four main portions: the pin pattern generators 24; the I/O select circuits 28, the programmable controllers 26; and the error logs, both the error data log contained in each pin pattern generator 24 and the error flag log 30. The remaining blocks illustrated in FIGS. 3A–3C are used for signal distribution. Time multiplexing is preferably used to reduce the number of drivers and amplifiers needed to propagate the signals throughout the pattern generator, and a timing generator (system clock) is implied but not shown.

In the illustrated example, the array tester has 256 input/output (I/O) ports, and a separate pin pattern generator 24 provides a serial pattern to each tester I/O through a respective driver/receiver. Each of the pin pattern generators 24 should have the following capabilities:

1. It should be able to read out a string of 1's and 0's (a word) that represents a portion of the required pattern at that pin.
2. It should be able to repeat any "word" a predetermined number of times.
3. It should be able to repeat a prescribed sequential set of "words" a predetermined number of times.
4. It should be able to repeat a prescribed combination of sequential sets of "words" a predetermined number of times.
5. When a pin is assigned by software the function of a receiver, that pin pattern generator should be capable of providing expected data and error mask data at the same time.
6. When used in the receive mode, the pattern generator should be capable of storing errors detected at that pin and setting up an error flag.
7. Upon completion of a "subroutine" (a string of all preassigned repeats as defined in items 2, 3 and 4 above) the pin pattern generator should respond to the next address as received from the programmable controller.
8. In general, the number of repeat loops necessary in each pattern generator is dependent upon the overall test pattern sequence for the particular DUT. In a preferred embodiment, the desired test pattern may require a minimum of three repeat loops.

The I/O select circuits 28 each comprise an I/O select card having a 1:8 selection capability. Thus, for a system having 256 pin pattern generators 24, there will be thirty-two 8-way I/O select cards. Each I/O select card has at its disposal the data from all programmable controllers, and the I/O select circuits perform the function of connecting any of the programmable controllers to any set of pin pattern generators.

The distributed pattern generator can include any number of programmable contollers. The output from the programmable controllers is an address into the pin pattern generator array and represents the first "word" of the desired subroutine. For the pin pattern generator to be completely under the control of the programmable controller, each subroutine can be made to be one word.

In the preferred embodiment described herein, there are four programmable controllers. Each controller preferably has a specific task assigned to it, with the four main tasks being:

1. Device Under Test (DUT) address generation.
2. Data input to the DUT.
3. Control data for the DUT.
4. Expected data and Error Mask.

If the assignment of the programmable controllers is as defined above, the I/O pins that generate the DUT address would all be tied to controller #1, data input pins would be connected to controller #2, etc. For example, for a desired data-in pattern, controller #2 would provide an address to all pin pattern generators associated with the DUT input data. At this address, in all pin pattern generator arrays associated with DUT data inputs, a word of the required data-in for the DUT would exist.

Since the number of programmable controllers in a system is relatively small, they can be made as complex as necessary without seriously effecting the overall cost. In a preferred embodiment, the programmable controllers will have the following features.

First, the programmable controllers should be able to execute a FORTRAN-like program with up to four nested DO loops. The inner DO loops will have start and/or stop counts which can be dependent on the status of outer loops or set to a stored constant. All DO loops will increment in steps not necessarily equal to 1.

Second, the output from the programmable controllers (which is an address into the pin pattern generator) will be created by two operations of an Arithmetic Logic Unit (ALU), i.e., add, subtract, etc. The input variables to the ALU will be the status of all DO loop counters and a stored constant value.

Third, the cycle time for each new output from the programmable controllers will be made identical to the cycle time for the pin pattern generators.

The final portion of the distributed pattern generator according to the present invention is the error log. The actual errors as detected are logged in the error array on the pin pattern generator. The error flags that are provided as an output from the pin pattern generator are logged in the main error log together with the cycle count in which the error occurred. By means of the two error logs and the knowledge of what is happening at each pin pattern generator, the failing condition can be identified.

An example of the operation of the illustrated embodiment will now be described. With reference first to the block diagram of a programmable controller shown in FIG. 4, a memory address counter 40 receives a start address from the central control computer (not shown). The start address is then loaded into the memory addresss counter 40 and is then provided as an address to a memory 42. The memory 42 is preferably a 256×181 memory, i.e., it stores 256 words addressed by the 8-bit output from the memory address counter 40, with each of the 256 words including 181 bits. As described above, the programmable controller according to the preferred embodiment of the present invention will be able to execute up to four nested DO loops, and each of the 256 words stored in the memory 42 will include a first field portion for indicating the start, stop and increment data for each of the DO loops. Each of the 256 words includes a further portion representing pin address data.

Upon receiving the first memory address from the memory address counter 40, the memory 42 provides the corresponding word at its output. The DO loop start, stop and increment data are provided to the DO loop logic 44, which will include whatever hardware is necessary to perform the nested DO loops, such as presettable counters, registers and comparators. The logic 44 will provide an output on line 46 to the pin address generator 48, with the signal on line 46 being dependent upon the collective states of the DO loops. In the preferred embodiment, the signal on line 46 may represent the status of all DO loop counters. The logic 44 will cycle through its DO loops under the control of clock signals from a clock signal source 50.

To illustrate more particularly the operation of the DO loop logic 44, the first word read out of the memory 42 may include start, stop and increment data for two loops together with data for a first output statement. For example, if the first portion of the programmable controller cycle is defined by:

DO 1 I=2, 10, 2
DO 1 J=I, 64, 1
1 OUT=2+2I+4J, the loop data provided to the loop logic will include the start, stop and increment data for both loops and the pin address data provided to the pin address generator 48 will indicate that the output of the programmable controller should be 2+2I+4J. The start, increment and stop data are all stored in registers within the logic 44. At the next clock signal, the logic sees that it is already at the address at which the loop ends, and that it is time to go back to the memory address location at which the loop began while incrementing the loop counter by whatever the designated increment value is. In this case, the address for the start of the loop is the same, and the address output from the logic 44 to the memory address counter 40 remains the same while the counter for the inner loop is incremented by 1. Since the output from the pin address generator 48 is a function of the count status in each of the loops, the output from the pin address generator 48 will change even though the address to the memory 42 remains the same.

This will repeat through a cycle of 62 counts for the inner loop. When the count value for the inner loop has reached a value of 64, the logic will determine that the inner loop counter has reached its maximum value. At the next clock cycle, the I-value counter will be incremented by 2 to a value of 4, the inner loop counter will be set to a value of J=I=4, and the inner loop will then cycle through 60 counts until it again reaches its maximum value of 64. This process continues, with the loop counters incrementing at each clock and the output from the pin address generator 48 changing even though the address to the memory 42 remains the same. When the logic determines that all counters have reached their maximum counts, the register 40 is then loaded with the next address.

The pin address generator 48 may preferably be an Arithmetic Logic Unit (ALU) which will perform at least two arithmetic operations, e.g., add, subtract, etc., on its input variables for every 64 ns cycle. A portion of its input variables will be the output signal on line 46 from the DO loop logic circuitry 44, and a remaining input variable will be a stored constant value. The particular arithmetic operation to be performed will be defined by the pin address data provided from the memory 42 in response to the current memory address supplied from the memory address register 40. The output from the pin address generator 48 will then be provided to the multiplexer and 4-way driver circuit 52 in FIG. 3A.

The operation of the programmable controllers can be more fully understood from the following description of a more typical example of a program to be followed by the controller. The example used for the following description will be that of a commonly-used four-step pingpong RAM test pattern. On an initial pass, all 1's are loaded into the memory locations, and the test pattern then performs the following operation $$\sum_{H=0}^{ALL} \sum_{A=0}^{ALL} (R_A + R_H + WC_A + R_H)$$

In other words, beginning with all 1's written into the memory, and with both the home address and away address set to 0, the tester first reads the contents of the away address location, then reads the contents of the home address location, then writes into the away address location the complement of the contents already stored there, and finally again reads the contents of the home address location. By successively incrementing the away address location, the pingpong test can be carried out for all combinations of a particular home address and all away addresses. The home address can then be incremented by 1 and the process repeated. The beginning of the sequence can be illustrated as follows:

| H ADD | A ADD | $R_A$ | $R_H$ | $WC_A$ | $R_H$ |       |
|-------|-------|-------|-------|--------|-------|-------|
|       | 0     | 1     | 1     | 0      | 0     | H=A   |
|       | 1     | 1     | 0     | 0      | 0     |       |
|       | 2     | 1     | 0     | 0      | 0     |       |
| 0     | 3     | 1     | 0     | 0      | 0     |       |
|       | .     | .     | .     | .      | .     |       |
|       | N−1   | 1     | 0     | 0      | 0     |       |
|       | 0     | 0     | 0     | 1      | 0     |       |
|       | 1     | 0     | 0     | 1      | 1     | H=A   |
|       | 2     | 0     | 1     | 1      | 1     |       |
| 1     | 3     | 0     | 1     | 1      | 1     |       |
|       | .     | .     | .     | .      | .     |       |
|       | N−1   | 0     | 1     | 1      | 1     |       |
|       | 0     | 1     | 1     | 0      | 1     |       |
|       | 1     | 1     | 1     | 0      | 1     |       |
|       | 2     | 1     | 1     | 0      | 0     |       |
| 2     | 3     | 1     | 0     | 0      | 0     | H=A   |
|       | .     | .     | .     | .      | .     |       |
|       | N−1   | 1     | 0     | 0      | 0     |       |

The address sequence (ADDRESS), data input (DATA IN), expected data output (EXPD), mask data (MASK) and read/write control data (R/W) follow sequences commencing as follows:

| ADDRESS 4 3 2 1 0 | DATA IN | EXPD. | MASK | R/W |
|-------------------|---------|-------|------|-----|
| 0 0 0 0 0         | 0       | 1     | 1    | 1   |
| 0 0 0 0 0         | 0       | 1     | 1    | 1   |
| 0 0 0 0 0         | 0       | 0     | 0    | 0   |
| 0 0 0 0 0         | 0       | 0     | 1    | 1   |
| 0 0 0 0 1         | 0       | 1     | 1    | 1   |
| 0 0 0 0 0         | 0       | 0     | 1    | 1   |
| 0 0 0 0 1         | 0       | 0     | 0    | 0   |
| 0 0 0 0 0         | 0       | 0     | 1    | 1   |
| 0 0 0 1 0         | 0       | 1     | 1    | 1   |

-continued

| ADDRESS<br>4 3 2 1 0 | DATA IN | EXPD. | MASK | R/W |
|---|---|---|---|---|
| 0 0 0 0 0 | 0 | 0 | 1 | 1 |
| 0 0 0 1 0 | 0 | 0 | 0 | 0 |
| 0 0 0 0 0 | 0 | 0 | 1 | 1 |
| 0 0 0 1 1 | 0 | 1 | 1 | 1 |
| 0 0 0 0 0 | 0 | 0 | 1 | 1 |

-continued

| ADDRESS<br>4 3 2 1 0 | DATA IN | EXPD. | MASK | R/W |
|---|---|---|---|---|
| . . . . . | . | . | . | . |

The appropriate bit pattern sequences could be generated as follows:

| ADDRESS<br>BIT LINE | PATTERN GENERATOR WORD (32 BITS) | REPEATS | |
|---|---|---|---|
| M=0 | 00001010000010100000101000001010 | N÷8 | N÷2 |
|  | 01011111101011110101111101011111 | N÷8 |  |
| M=1 | 00000000101010100000000010101010 | N÷4 | N÷4 |
|  | 01010101111111110101010111111111 | N÷4 |  |
| M=2 | 00000000000000001010101010101010 | N÷2 | N÷8 |
|  | 01010101010101011111111111111111 | N÷2 |  |
| M≧3 | 00000000000000000000000000000000 | $2^M \div 8$ | N÷2 |
|  | 10101010101010101010101010101010 | $2^M \div 8$ |  |
|  | 01010101010101010101010101010101 | $2^M \div 8$ | N÷2 |
|  | 11111111111111111111111111111111 | $2^M \div 8$ |  |
| DATA IN | 00000000000000000000000000000000 | N÷8 | N÷2 |
|  | 00100010001000100010001000100010 | N÷8 |  |
| R/W CONTROL | 11011101110111011101110111011101 | N·N÷8 | |

| ADDRESS |  |  |  |
|---|---|---|---|
| 0 0 0 1 1 | 0 | 0 | 0 |
| 0 0 0 0 0 | 0 | 0 | 1 | 1 |
| 0 0 1 0 0 | 0 | 1 | 1 | 1 |
| 0 0 0 0 0 | 0 | 0 | 1 | 1 |
| 0 0 1 0 0 | 0 | 0 | 0 | 0 |
| 0 0 0 0 0 | 0 | 0 | 1 | 1 |
| 0 0 1 0 1 | 0 | 1 | 1 | 1 |
| 0 0 0 0 0 | 0 | 0 | 1 | 1 |
| 0 0 1 0 1 | 0 | 0 | 0 | 0 |
| 0 0 0 0 0 | 0 | 0 | 1 | 1 |
| 0 0 1 1 0 | 0 | 1 | 1 | 1 |
| 0 0 0 0 0 | 0 | 0 | 1 | 1 |
| 0 0 1 1 0 | 0 | 0 | 0 | 0 |
| 0 0 0 0 0 | 0 | 0 | 1 | 1 |
| 0 0 1 1 1 | 0 | 1 | 1 | 1 |
| 0 0 0 0 0 | 0 | 0 | 1 | 1 |
| 0 0 1 1 1 | 0 | 0 | 0 | 0 |
| 0 0 0 0 0 | 0 | 0 | 1 | 1 |
| 0 1 0 0 0 | 0 | 1 | 1 | 1 |
| 0 0 0 0 0 | 0 | 0 | 1 | 1 |
| 0 1 0 0 0 | 0 | 0 | 0 | 0 |
| 0 0 0 0 0 | 0 | 0 | 1 | 1 |
| 0 1 0 0 1 | 0 | 1 | 1 | 1 |
| 0 0 0 0 0 | 0 | 0 | 1 | 1 |
| 0 1 0 0 1 | 0 | 0 | 0 | 0 |
| 0 0 0 0 0 | 0 | 0 | 1 | 1 |
| 0 1 0 1 0 | 0 | 1 | 1 | 1 |
| 0 0 0 0 0 | 0 | 0 | 1 | 1 |
| 0 1 0 1 0 | 0 | 0 | 0 | 0 |
| 0 0 0 0 0 | 0 | 0 | 1 | 1 |
| 0 1 0 1 1 | 0 | 1 | 1 | 1 |
| 0 0 0 0 0 | 0 | 0 | 1 | 1 |
| 0 1 0 1 1 | 0 | 0 | 0 | 0 |
| 0 0 0 0 0 | 0 | 0 | 1 | 1 |
| 0 1 1 0 0 | 0 | 1 | 1 | 1 |
| 0 0 0 0 0 | 0 | 0 | 1 | 1 |
| 0 1 1 0 0 | 0 | 0 | 0 | 0 |
| 0 0 0 0 0 | 0 | 0 | 1 | 1 |
| 0 1 1 0 1 | 0 | 1 | 1 | 1 |
| 0 0 0 0 0 | 0 | 0 | 1 | 1 |
| 0 1 1 0 1 | 0 | 0 | 0 | 0 |
| 0 0 0 0 0 | 0 | 0 | 1 | 1 |
| 0 1 1 1 0 | 0 | 1 | 1 | 1 |
| 0 0 0 0 0 | 0 | 0 | 1 | 1 |
| 0 1 1 1 0 | 0 | 0 | 0 | 0 |
| 0 0 0 0 0 | 0 | 0 | 1 | 1 |

As can be seen from the above table, if the pin pattern generator includes a memory which can read out a succession of 32-bit words, the serial pattern defined by the address bit line 0 can be obtained by repeating a first 32-bit word (N÷8) times (N=the number of words in the DUT) followed by a second 32-bit word repeated (N÷8) times, and this composite sequence is then in turn repeated (N÷2) times. The other address bit sequences could be obtained by similarly repeating appropriate 32-bit words. The data input pattern could be obtained by appropriately repeating a pair of 32-bit words, and the read/write control signal sequence could be obtained by repeating a single 32-bit word.

The expected data sequence is somewhat more complicated, since the away address position at which the data is the same as the home address position will change during each cycle of the test. However, the expected data sequence can be broken down into a relatively small number (e.g., 12) of frequently-repeated 32-bit patterns. These may be shown as follows:

| PATTERN NO. | EXPECTED DATA |
|---|---|
| #1 | 00000000000000000000000000000000 |
| #2 | 10001000100010001000100010001000 |
| #3 | 11001000100010001000100010001000 |
| #4 | 00000001010101010101010101010101 |
| #5 | 11011101100010001000100010001000 |
| #6 | 00000000000000010101010101010101 |
| #7 | 11011101110111011100100010001000 |
| #8 | 00000000000000000000000101010101 |
| #9 | 11011101110111011101110111001000 |
| #10 | 00000000000000000000000000000001 |
| #11 | 01010101010101010101010101010101 |
| #12 | 11011101110111011101110111011101 |

The above expected data patterns will be characteristic of the four-step pingpong RAM test regardless of memory size. If the pin pattern generators are under the complete control of the programmable controllers, i.e. each new output from the programmable controller results in a new pin pattern generator output, the following program will result in generation of the expected data from the twelve expected data words shown above for a DUT of at least 128 words:

| ADDRESS | | | |
|---|---|---|---|
| A | | DO 1000 | I = 1,N |
| | | DO 100 | J = 2,8,2 |
| | | OUT=J+1 | |
| B | | DO 10 | K=1, (N−32)÷32 |
| | 10 | OUT=2 | |
| C | | OUT=J+2 | |
| D | | DO 100 | K=1, (N−32)÷32 |
| | 100 | OUT=11 | |
| E | | DO 200 | J=1, (N−64)÷32,2 |
| | | DO 200 | K=2, 8, 2 |
| | | DO 125 | L=1,J |
| | 125 | OUT=12 | |
| F | | OUT=K+1 | |
| G | | DO 150 | L=J, (N−96)÷32 |
| | 150 | OUT=2 | |
| H | | DO 175 | L=1,J |
| | 175 | OUT=1 | |
| I | | OUT=K+2 | |
| J | | DO 200 | L=J, (N−96)÷32 |
| | 200 | OUT=11 | |
| K | | DO 1000 | J=2,8,2 |
| | | DO 250 | K=1, (N−32)÷32 |
| | 250 | OUT=12 | |
| L | | OUT=J+1 | |
| M | | DO 275 | K=1, (N−32)÷32 |
| | 275 | OUT=1 | |
| N | 1000 | OUT=J+2 | |

In the above program, the left-hand column labelled "ADDRESS" indicates an address in the memory 42. In response to each new address provided to the memory 42, an output must be provided from the programmable controller. Thus, in response to the start address A provided to the memory counter 40 and thence to the memory 42, a 181-bit word will be read out of the memory 42. The loop data portion of that word will indicate that the outside loop, hereinafter referred to as "the 1000 loop", is to start with this memory output word, with the value of the loop counter variable I beginning at 1 and having a maximum count value of N. The memory output word will further indicate that the first 100 loop commences at this address with an initial J value of 2, a maximum J value of 8, and an increment value of 2. Finally, the pin address data portion of the memory output word will indicate to the pin address generator 48 that the output is to be defined as OUT=J+1. The output provided from the pin address generator 48 at this initial memory address A will then have a value of 3, and the expected data pattern #3 will be read out of the memory in the pin pattern generator.

Since the memory word output to the logic 44 from the memory 42 does not indicate that any loop terminates at the current address, the next clock signal received from the clock source 50 will cause the logic 44 to provide a signal on line 54 incrementing the memory address counter 40 to a value of B. The new word read out of the memory 42 indicates that the 10 loop begins at the current address, terminates at the current address, has an initial loop counter value of K=1 and has a maximum loop counter value of (N−32)÷32. The pin address data portion of the output from memory 42 will indicate to the pin address generator 48 that the new output from the programmable controller is to be defined by OUT=2, and the programmable controller will then provide an output value of 2.

At the next clock signal, the logic 44 knows from the memory output data that the 10 loop terminates at the present address, and the 10 loop counter value is then incremented to a value of K=2 while an output is provided on line 54 to the memory address counter 40 representing the starting address of the 10 loop. However, since the 10 loop also starts at the address B, the output from the memory address counter 40 remains unchanged. The output from the address counter 40 will remain unchanged for a predetermined number of clock cycles until the 10 loop counter K reaches its maximum value. For a 256 word memory where N=256, the 10 loop counter K will count up to a maximum value of 7 while the programmable controller output remains at a value of 2.

When the 10 loop counter reaches its maximum value, the logic will examine the data from the memory 42 to determine if any other loops terminate at the present address. Since they do not, a signal on line 54 will be provided to the memory address counter causing that counter to increment to the next address C. At the address C, there is no further loop data provided to the logic 44, but the pin address data provided to the pin address generator 48 indicates that the next output should be defined as OUT=J+2, so that an output value of 4 will be provided from the controller. Since no loops terminate at the current address C, the memory address counter 40 will be incremented to the next address D.

At the address D, the loop data portion of the output from memory 42 indicates that a second 100 loop commences at the address D, that both the first and second 100 loops terminate at the address D, has an initial K value of 1 and a maximum count value of (N−32)÷32, i.e., a maximum count value of 7 for an N-value of 256. The pin address data portion of the memory output indicates that the current output should be defined as OUT=11, and the output value of 11 is therefore provided from the programmable controller to read out the pattern #11 from the memory in the pin pattern generator. At the next clock signal, the loop logic will know that the second 100 loop both commences and terminates at the current address, and the memory address counter will therefore continue to provide the same address while the second 100 loop counter value is incremented by 1. This will continue while the second 100 loop cycles up to its maximum count value of 7, all the while providing the same programmable controller output having a value of 11. When the second 100 loop has reached its maximum count value, the logic 44 will respond to the next clock signal by providing to the memory address counter 40 an address corresponding to the start of the first 100 loop, i.e., the address A, and the J-value counter will be incremented by 2 to a value of 4. In response to the address A, the pin address generator will now provide a programmable controller output of OUT=J+1=5.

This process will continue cycling through addresses A-D until the J counter has reached its maximum value of 8 and the K counter for the second 100 loop at address D indicates a maximum value of 7. In response to the next clock signal, the loop logic 44 will increment the memory address counter 40 to the next address E.

At the address E, the memory 42 will provide loop data to the logic 44 indicating the commencement of an outer 200 loop and an inner 200 loop and will also indicate both the commencement and termination of the 125 loop. The output from the pin address generator will be defined as OUT=12. In response to the next clock signal, the logic will determine that the 125 loop counter L has reached its maximum value of 1, and the address will then be incremented to a value of F at which an output value of OUT=K+1=3 is generated. The address is then incremented to a value G where the 150 loop both commences and terminates so that the address to the memory 42 will remain at a value of G for a period of $((N-96)\div 32)-J=4$ more clock cycles until the 150 loop counter L reaches its maximum value of 5. During this period of time, the pin address generator 48 will continuously provide an output value of OUT=2.

The programmable controller will continue cycling through the memory addresses in a manner which will be clear from the description above. When the memory address N is reached, the logic will cycle back to the address K at which an inner 1000 loop commences, and the logic will cycle through addresses K-N until the J counter value in the inner 1000 loop commencing at the memory address K reaches its maximum value of 8. At J=8, the next clock signal received during a memory address counter 40 output value of N will result in the logic 44 providing to the memory address counter 40 the address A corresponding to the commencement address of the outer 1000 loop. At this time, the outer 1000 loop counter I will be incremented to a value of 2, and the entire process will repeat.

In this way, the programmable controller can respond to a single starting address by providing a sequence of outputs having a predetermined output pattern. The output from the programmable controller can change every 64 ns, or it can be maintained for some period of time as determined by the DO loop operations. In the particular program described above, there are at most four DO loops active at any one time, and the logic 44 in FIG. 4 is therefore capable of handling up to four nested DO loops. The particular sequence of controller outputs to be provided will be dependent upon the data stored in the memory 42 in each controller, and this can be loaded into each memory, e.g. into the memory 42 in the controller #1 via bus 49 as shown in FIG. 3A. The memories 42 in the remaining controllers are similarly connected via a bus to the central control computer, but the bus need not be illustrated for a proper understanding of the invention and has therefore been omitted for purposes of simplification of the drawings.

The loading of data into a memory is also a well-known process and need not be described in any detail. The central control computer preferably stores a plurality of different programs corresponding to respective components or parts to be tested, and it is merely necessary for the operator to designate the part number to the central control computer and the central control computer will then load the appropriate programming into the programmable controllers.

The remaining three programmable controllers will operate in substantially the same manner to produce pin pattern generator starting addresses for the data into the DUT, the control lines for the DUT and the expected data and error mask data. In response to a 4×clock signal, the multiplexer 52 will multiplex the data from all four programmable controllers to each of the four 8-way drive amplifier circuits 54. Each of the 8-way driver amplifier circuits 54 will provide eight outputs to respective ones of the 8-way I/O select circuits, so that each of the I/O select cards has at its disposal the data from all of the programmable controllers. As will be described later, each of the 8-way I/O select circuits will have been programmed in advance to indicate the correspondence between each of its respective pin pattern generators and a particular one of the programmable controllers. For example, of the 8 pins served by the pin pattern generators coupled to the I/O select circuit #1, some may be designated as address pins, some will be data input pins, etc. For any pin designated as an address input pin, its respective pin pattern generator will respond to the output of programmable controller #1. For any pin designated as a data input pin, its pin pattern generator will respond to the output from programmable controller #2. Since the outputs from all four programmable controllers will be received in time-multiplexed form by each of the I/O select circuits, it is a straightforward matter for each I/O select circuit to time demultiplex its input onto appropriate outputs.

The data received at each pin pattern generator from its respective programmable controller will include address data identifying a location in that pin pattern generator that contains the first "word" of the desired subroutine, and the pin pattern generators 24 respond to the address data to initiate their "subroutines" in which they serially read out a string of 1's and 0's (a word) representing a portion of the required test pattern. The pin pattern generator then repeats words, sets of words and sequences of word sets to provide the desired bit sequence at that pin. In the example above, each subroutine is only one word in length so that the pin pattern generator will respond to each new address provided from the programmable controller. If longer subroutines are used, the pin pattern generator will ignore new addresses from the controller until the loop logic indicates that the next address from the controller is to be accepted.

Figure 5:
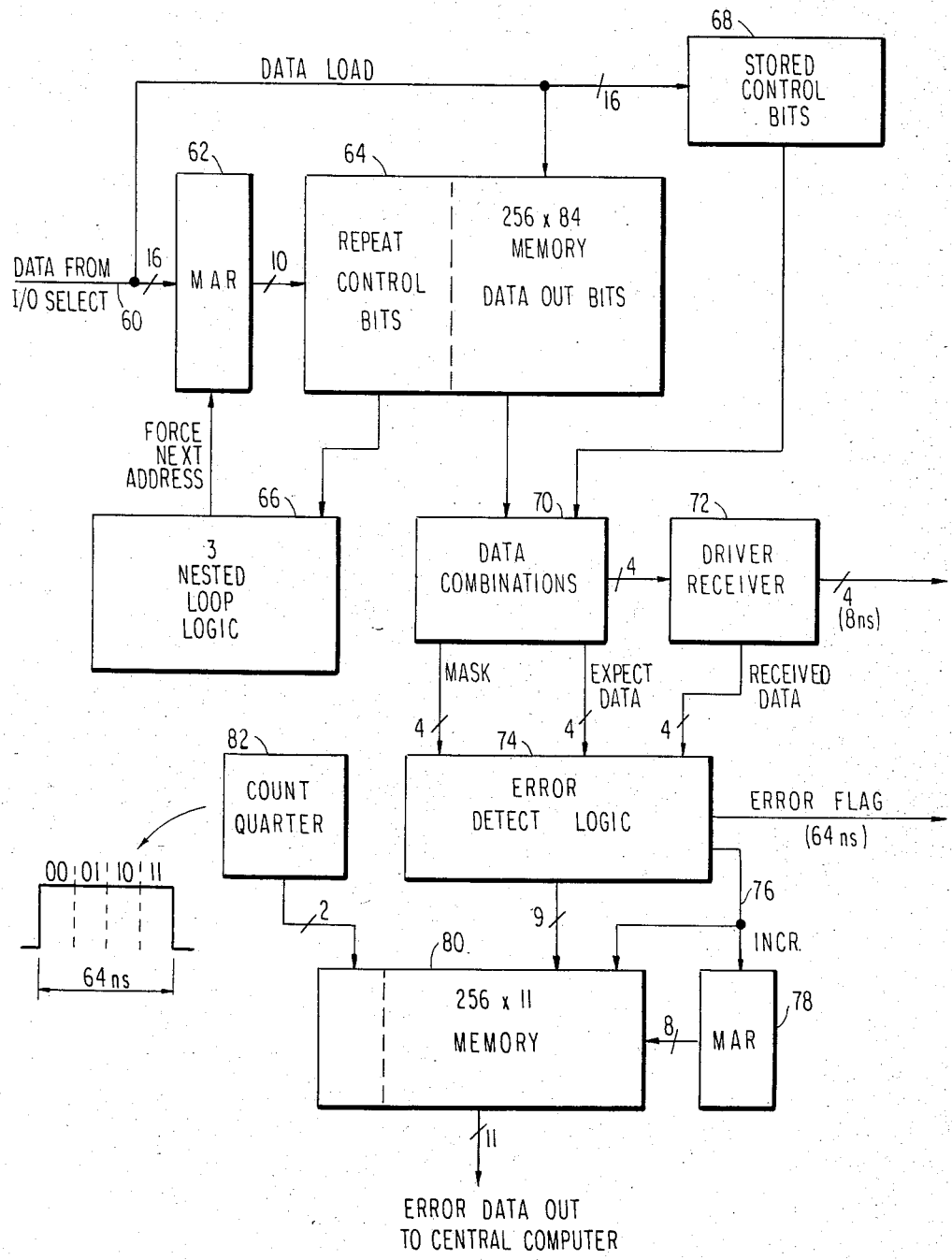
FIG. 5 is a block diagram of a pin pattern generator and error data log in FIG. 3B.

The operation of each individual pin pattern generator is somewhat similar to that of the programmable controllers and can be more clearly understood with reference to the block diagram of FIG. 5. Upon receiving data on line 60 from an I/O card, the starting address for the subroutine is stored in a Memory Address Register (MAR) 62, which may be a register or a presettable address counter. This starting point address is then provided to a memory 64 which is preferably a 256×84 memory for storing 256 words addressable by the 8-bit address from MAR 62, with each of the 256 words including 84 bits. Each word includes a first portion containing repeat control bits, e.g. DO loop start, stop and increment data similar to the data provided from the first portion of memory 42 in FIG. 4. The left-hand portion of the memory 64 may be referred to as a program storage means, with the right-hand portion of the memory 64 being referred to as pattern generator storage means. A difference in the repeat control bit data provided to the nested loop logic 66 in FIG. 5 is that all DO loop counters are incremented by a value of 1, and the maximum count value for each loop is fixed, as opposed to the maximum count values in some of the DO loops in the logic of FIG. 4 which may vary depending upon the count value in a different loop. The remainder of each word represents data to be provided to the DUT pin.

The nested DO loop logic 66 will cycle through its three DO loops in accordance with the repeat control bits received from the memory 64 and, upon completing its cycle, will provide a signal to the MAR 62 to cause the MAR 62 to increment to the next address. The nested loop logic 66 will operate in response to clock signals from a clock source (not shown) at the same rate as the clocks from the clock source 50 in FIG. 4. The cycle time for the nested loop logic 66 should be identical to the cycle time for each new output from the programmable controller.

The register 62, memory 64 and loop logic 66 in FIG. 5 may be referred to as a programmed means and operate in a manner substantially similar to the counter 40, memory 42 and logic 44 in FIG. 4, and a further detailed description need not be given at this time. However, two examples of pattern to be generated will be described in order to provide a better appreciation of the concept of the distributed pattern generator according to the present invention. A first example will concern the generation of an input sequence to the lowest order address bit of the DUT, while the second example will concern the generation of an input sequence to a higher order address pin of the DUT.

For the first example, it is assumed that the DUT is an array which is 1024 words wide, so that a sequence of 1024 different addresses should be applied during a particular test. The lowest order address bit will follow a pattern 01010101... throughout the sequence of 1024 addresses. If the data output bit portion from the memory 64 in FIG. 5 includes 32 bits, then one word in the memory 64 can be loaded with an alternating 0101 pattern 32 bits long and the required 1024 bit pattern can be achieved by repeating this word 32 times. The repeat control bits included in that word will indicate to the nested loop logic 66 that the same address should be maintained for 32 clock cycles to thereby achieve the desired 1024 bit pattern.

For the case of a pin pattern generator generating the input bit sequence to a higher order address bit, the required bit sequence may, e.g., be 64 0's 64 1's, followed by 64 0's, etc. For a 32-bit output from the data output portion of the memory 64, the required 1024 bit pattern can be obtained by reading out an all 0's data word twice, followed by twice reading out an all 1's data word, followed by twice reading out the all 0's data word, etc., until the required 1024 bits are obtained. In this case, a first 32-bit data word can be written into the memory 64 at an address A together with repeat control bits indicating that a first loop starts and terminates at the address A and has a maximum loop counter value of 2. Also included at the address A will be repeat control bits indicating that an outside loop commences at the address A and has a maximum loop counter value of 8. A second word can be loaded at an address B in the memory 64 with the data portion comprising 32 1's and the repeat control bit portion indicating a second loop which commences and terminates at the address B and has a maximum count value of 2. The repeat control bit portion of this second word can also indicate that the outer loop commencing at address A terminates at this address B. With this arrangement, the starting address will be loaded into the register 62 and the 0's data output will be provided from the memory 64 for two cycles of the first loop, the loop logic 3 will then load the next address B into the register 62 and the all 1's data output from the memory 64 will provided for two cycles of the second loop, the loop logic will then load the address A into the register 62 and increment the outer loop counter by 1, and the process will continue until 8×128=1024 bits of address have been generated.

A control latch 68 stores control bits indicating whether the particular pin pattern generator is to act as a driver or receiver. The data combination circuit 70 responds to the contents of the control latch 68 to provide data through the driver/receiver circuit 72 to the pin electronics if the pin pattern generator is acting as a driver, and to provide mask data and expected data to the error detect logic 74 while also enabling the error detect logic if the pin pattern generator is designated as a receiver. The data combination circuitry 70 can be comprised essentially of shift registers for receiving a 32 bit parallel input from the data output portion of the memory 64 and then providing the bit sequence in parallel four bits at a time to the driver/receiver circuit 72 or to the error detect logic 74.

The reason for reading out the data from the data combination circuit 70 in 4-bit parallel form is that the pin electronics are operating at a 500 mHz rate and are physically located in the vicinity of the DUT. However, as a practical matter, the pattern generator may be located a substantial distance from the pin electronics, e.g., 20 feet, and the maintenance of synchronized communication at a 500 mHz rate over a distance of 20 feet can be quite difficult. Accordingly, the pin electronics are provided with 4:1 multiplexing capability, which may be in the form of a simple 4-bit parallel-to-serial converter. In this way, all communications between the driver/receiver circuit 72 and the corresponding pin electronics are carried out at a 125 mHz rate while the pin electronics operates a 500 mHz rate.

With the arrangement described thus far, it can be seen that the programmable controllers can be used to provide "seed" data to the individual pin pattern generators which will then generate the desired bit sequences for their respective DUT pins.

For each vector applied simultaneously to all 256 DUT pins, some pins will be designated as receivers for purposes of monitoring the response of the DUT. When the control bits stored in the storage device 68 at any particular pin pattern generator indicate that that pin pattern generator is to act as a receiver, the data combination circuit 70 provides the data output bits from memory 64, which comprise mask data and expected value data, to the error detection logic circuitry 74. The data from the respective DUT pin will be provided through the driver/receiver 72 to the error detection logic 74, and a comparison will be performed to determine whether or not the received data is in agreement with the expected data. The comparison between the received and expected data can be accomplished in a straightforward manner through a plurality of Exclusive OR (EOR) gates. A plurality of gates, e.g. AND gates, each of which is enabled by a respective bit of the mask data, can receive respective outputs from the EOR gates in a known manner to mask out received data from pins which are of no concern in a particular cycle.

The error detect logic will therefore generate four new bits of error data at a 125 mHz rate, or every 8 ns. Since it would be difficult to write this data into a memory at a 125 mHz rate, the error detect logic includes latch circuitry for storing the four bits of error data until the next four bits of error data are received. The error data can then be written into the memory 80 eight bits at a time every 16 ns. If an error is detected, a signal is provided on line 76 to increment a memory address register 78, which may be a simple ring counter, and the memory address register 78 then provides the next 8-bit memory address to a 256 word by 11 bit memory 80. A signal on line 76 is also provided as a load enable signal to the memory 80, and, at the particular one of the 256 word locations addressed by the 8-bit address from the register 78, the memory 80 stores an 11-bit word including 9 bits representing the detected error and 2 bits received from a count quarter circuit 82 and representing the particular quarter of the 64 ns test period during which the error occurred. An error flag is also generated.

The reason for the quarter counter 82 is that the error flag provided from the error detect logic 74 occurs at a slower rate, i.e. every 64 ns, synchronized to the remainder of the system. Since the 8 bits of error data written into the memory 80 are generated by the logic 74 every 16 ns, some means must be provided for indicating during which quarter of the 64 ns error flag period an error occurred. Accordingly, the quarter counter 82 provides two additional bits of input to the memory 80 so that, as soon as the signal on line 76 occurs to enable the loading of the memory 80, the quarter count at that time will also be loaded in as an additional 2 bits.

Since the error flag can be provided only once every 64 ns, there may occur a situation in which a single error flag is provided but more than one of the 8-bit quarters provided from the error detect logic 74 contain an error. In order to detect this situation, an additional bit is provided from the error detect logic output to the memory 80, the additional bit having a 0 for the first error which occurs during a 64 ns cycle and having a 1 value for subsequent errors. This "continuation bit" will then indicate that a plurality of error detection logic outputs are to be considered together.

After a test has been completed, the central control computer can examine the value in the MAR 78 to find out how far down in the memory 80 the error data has been written. The MAR 78 is then reset to 0 and clocked through the range of addresses at which error data have been written, with the error data being read out from the memory 80 to the error combination circuits 90 in FIG. 3C. The combiner circuits 90 may comprise thirty-two 8-way OR combination circuits, each receiving eight 11-bit error data signals from eight respective pin pattern generators and providing a single 11-bit output. As but one example, each combination circuit 90 could include 11 OR gates with each OR gate receiving one bit from each of the eight error data outputs provided to the associated combiner. When reading out the error data from a particular pin pattern generator, all input signals to the combiners 90 will be forced to 0 with the exception of the particular input of interest, so that the particular data input will be passed through the OR circuits 90. The final error combiner may similarly comprise 11 OR gates each having 32 inputs, so that the error data from the pin of interest is passed through the combiners 90 and 92 to be received by the central control computer.

The error flags provided as an output from the error detection logic 74 are supplied to the error flag log 30. This can be achieved by directly applying 256 inputs to the log 30, or the error flags can be supplied to appropriate 8-way multiplexers 94 in FIG. 3C and forwarded from there to the error flag log 30. The details of the error flag log 30 can be more clearly understood from the block diagram of FIG. 6. As shown therein, the multiplexed error flags from each of the thirty-two 8-way multiplexers 94 in FIG. 3C are provided to respective shift registers 96 in FIG. 6. The multiplexers 94 in FIG. 3C will provide an 8 bit serial output for each 8 bits of parallel input received from the respective 8 pin pattern generators, and the shift registers 96 in FIG. 6 will be serial in-parallel out shift registers each having an 8-bit parallel out shift registers each having an 8-bit parallel output. Thus, the collective 8-bit outputs of the 32 shift registers 96 in FIG. 6 will at any given time represent all 256 error flags provided simultaneously from the 256 pin pattern generators 24 at some previous time.

Figure 6:
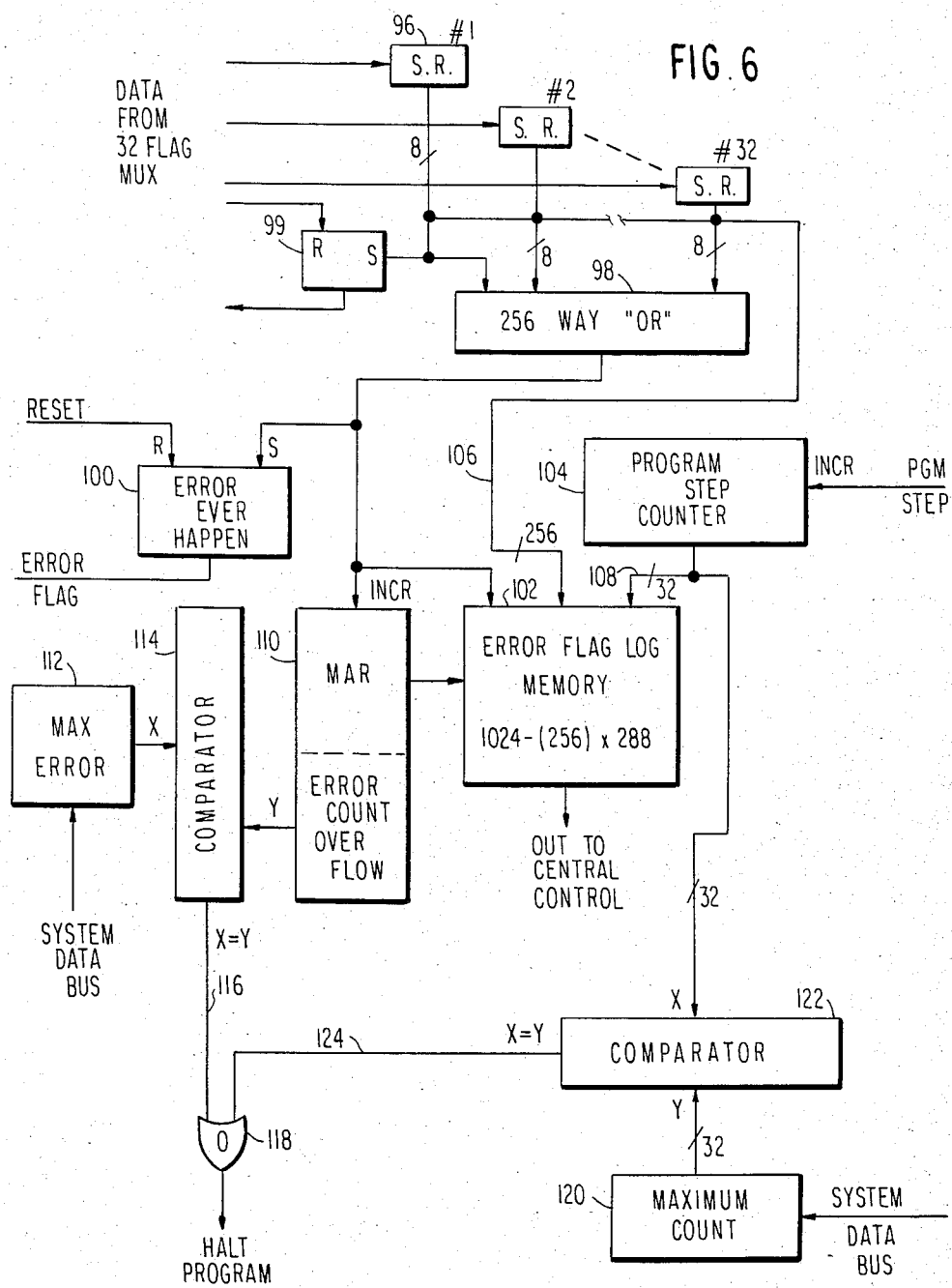
FIG. 6 is a block diagram of an error flag log in FIG. 3C.

The output of each shift register 96 is preferably coupled not only to the 256-way OR gate 98 but also to the set input terminal of a flip-flop 99. Only a single flip-flop 99 is illustrated in FIG. 6 for sake of simplicity, although it should be understood that 256 such flip-flops would be provided. In this way, the particular pin or pins at which an error occurred during the test can be indicated. In addition, the 256-way OR gate 98 may receive the 256 flag bit outputs and provide a set signal to a flip-flop 100 if any of the 256 flag bits indicates an error, thus indicating that there has been at least one error detected during the test.

The 256-bit collective output from the shift registers 96 is also provided as a single 256-bit input word to an error flag log memory 102. A program step counter 104 is incremented at each new program step in synchronism with the change in outputs from the data combination circuitry 70 in FIG. 5, so that the output of the counter 104 indicates the test pattern cycle count in which the error condition on line 106 occurred. The error flag status on line 106 and the cycle count on line 108 are then combined into a 288-bit word and stored in the error flag log memory 102 at an address determined by the output from a memory address register 110.

The memory address register 110 is a counter incremented each time there is an error indication at the output of the OR gate 98, so that the address to the memory 102 will only be incremented each time an error occurs. The error indication from OR gate 98 is also provided as a load enable signal to the memory 102. The value in the address register 110 will thus not only indicate an address to the memory 102 but will also indicate the number of program cycles which have failed. A maximum allowable number of failed cycles is stored in a register 112 and its value is provided as one input to a comparator 114. When the value in counter 110 equals that stored in the register 112, the comparator 114 provides an output on line 116 which is passed through OR gate 118 to halt the testing program.

The purpose of the comparator 14 can be more easily appreciated by referring again to FIG. 5. The memory 80 in FIG. 5 is capable of storing 256 words and, in the event that more than 256 failed cycles occur during any given test, some of the first 256 error words are in danger of being written over and therefore lost. Accordingly, the register 112 in FIG. 6 can be set to a value of 256, and the test program can be halted at this point to allow the central control computer to read out the 256 error words already stored in the memory 80. The register 112 can then be set to a value of 512 and the test can be continued. If it is a time-dependent test, the test will be restarted from the beginning and the first 256 error words stored in the memory 80 will merely be written over by the second 256 error words, at which point the program will again be halted and the second 256 error words read out of the memory 80, etc. If the test is not a time-dependent test, the test program can be resumed from the point at which it was halted as soon as the contents of the memory 80 have been read out. Of course, in order to permit the program to continue to run after 256 failed cycles have occurred, the counter 110 must be provided with an appropriately large capacity.

A maximum allowable program step number is stored in a register 120 and its value provided as one input to a comparator 122. When the output from program step counter 104 indicates that the testing program has reached a particular value, the comparator 122 provides an output on line 124 which is similarly passed through the OR gate 118 to halt the testing program. This is useful, e.g., for halting the test program at a particular cycle count where an error has been found to occur.

The 288-bit words in the error flag log memory 102 are read out to the central control computer to indicate to the central control computer the error flag status of the DUT at each test program step. From the error data from the final error combiner 92 and from the knowledge of what is happening at each pin pattern generator as represented by the output of memory 102, the failing condition can be more particularly identified.

The above description concerns the operation of a distributed pattern generator having already been programmed to test a particular DUT. The programming of the distributed pattern generator will be a relatively straightforward matter, once given the description above concerning the operations to be formed by the controller, and no detailed description of the programming need be given herein. Briefly, in reponse to the designation by the operator of the part number of the DUT, the central control computer will provide a programming signal sequence via bus 49 to the multiplexer 52. Each work will include control and data fields, with the control field indicating the disposition of the data field, e.g., a control field may command a latch select with the following data field indicating which I/O output is to be selected, or a control field may command MAR load, with the following data field indicating the value to be loaded, etc. A small portion of the data field will be used to load control registers in each of the I/O select circuits 28 to designate to each I/O select circuit the particular programmable controller which each pin it controls is to follow and whether or not each pin pattern generator will be "on" or "off" during the test. For example, if an I/O select circuit associated with pin #1 is to be used to pass the DUT address information, its control latch will be loaded with an indication that, during the testing operation, it is to select from its input the information received from the programmable controller #1. The remainder of the data will be passed on to the respective pin pattern generator for storage in both the memory 64 and control latch 68. The programmable controllers are programmed by the central control computer in a similar straightforward manner, except there is no need to pass the program information through the multiplexer 52.

The hardware components used in the embodiment described above need not be illustrated in detail for a proper understanding of the invention, since much of the hardware is well-known and commercially available. As described above, the data combination circuit 70 may comprise simply a plurality, e.g., four, shift registers. Rather than loading each 32-bit memory output word in its entirety into a separate shift register, the shift registers will receive appropriate bits such that four consecutive bits of the desired pin pattern will be present simultaneously at the outputs of the four shift registers. Simple gate circuitry can also be provided to respond to the signal from the control latch 68 to pass the shift register outputs either to the driver/receiver circuit 72 or to the error detect logic 74. The memory address register 62 may be a presettable counter, but it is sometimes difficult for the counter to increment fast enough. Thus, a separate counter may be provided to count to the next desired address, and the register 62 can be incremented when desired by always loading the prepared address into the register.

The pin address generator 48 may be a simple arithmetic circuit for performing the desired mathematical operations. More particularly, in the example described above wherein the output signal is defined as OUT=2+2I+4J, the multiplication can be achieved by simply shifting the data in a shift register, with the first multiplication being obtained by shifting by one position and the second multiplication being obtained by shifting by two positions. If shift registers are used for multiplication, all multiplications will be by some multiple of 2. During a 64 ns cycle, at first pass through the ALU will generate 2+2I=X, and a second pass will generate X+4J=OUT.

In the I/O select circuitry, there will be an internal register for each output bus, as described above, for storing an indication as to which programmable controller each pin pattern generator controlled by the I/O select circuit is to follow during the testing operation. There will be a further register indicating an "on" or "off" state, i.e., whether or not the corresponding pin pattern generator is to be used in the test. These can be combined into a single thee-bit register. There will be also be a select latch used during the program loading process to indicate that the particular I/O has been selected by the central control computer. If a command has been received to set the latch, each subsequent load signal received from the central control computer will cause that select circuit bus to merely pass its data to its pin pattern generator. The select latch can then be reset to "free" that select circuit bus. In the reset state, any further load signals received from the central control computer requesting pass through of data to the pin pattern generators will be ignored by the de-selected I/O circuit. During the testing operation itself, the latch should either be reset or ignored.

The stored control bits latch 68 in FIG. 5 will store control bits indicating whether the in pattern generator is to act as a driver or receiver, and the latch 68 may also store control bits designating the partitioning of the output from the memory 64. More particularly, in addition to at least one bit designating the pin pattern generator as either a driver or receiver, the latch 68 may designate any one of four different modes of operation. In a mode 00, normal testing operation will be conducted with 32-bit data output words from the memory 64 as described above. In mode 01, with the pin pattern generator being designated as a receiver, there will be 32 bits of expected data and 32 bits of mask data provided from the memory 64 to the data combination circuitry 70.

When conducting Read Only Store (ROS) testing in which it is desirable to generate large quantities of data which may be random and will therefore not lend itself to repeat loops, the partitioning of the memory 64 may be changed such that 64 output bits are used as expected data. In this case (mode 10), the control field will be reduced and will only be capable of controlling one loop instead of three, but this would be acceptable due to the more random nature of the expected data. In addition, a default mask may be stored in the latch 68 and provided to the data combination circuit 70. In this case, since the output to the data combination circuit 70 from the memory 64 is only 32 bits, but since 64 bits of each word in the memory 64 may be used as expected data, an additional bit from the MAR 62 is used to designate which half of the 64-bit data field is to be read out.

Finally, in generating $N^2$ ROS test patterns, only alternate test cycles require useful expected data. In such a case, each sequence of 32 bits of expected data can be generated by taking 16 bits and repeating each bit for two cycles. A default mask of 0101 can be provided from the latch 68 to the data combination circuit 70. Accordingly, in mode 11, the memory 64 may be partitioned such that 64 bits of each word are used for expected data, and ninth and tenth bits from the MAR may be used to designate to the memory 64 the particular quarter (16 bits) of each 64-bit expected data word presently to be read out to the data combination circuit 70.

As will be understood from the above description, the distributed pattern generator of the present invention is capable of high data rates, since the rate at which each pin input changes will on the average be significantly less than the rate at which the overall test pattern input changes. It should also be noted that, while the above description is directed to a testing system operating at a 500 mHz rate, the operating frequency may be anywhere from 0 up to the maximum design capability of the system. The pin pattern generator is highly flexible in that the pattern at each pin can be individually controlled and any pin can be designated as a control, data or address pin. The architecture is expandable to any number of pins, and the system has a programmable algorithmic capability to generate large test patterns.

We claim:

1. An apparatus for testing an array having a plurality of terminals, said apparatus testing said array by applying a sequence of test vectors to said array terminals with each said test vector including a plurality of bits each of which is applied to a respective one of said array terminals, each terminal receiving a serial pattern of bits as its respective portion of said sequence of vectors, said apparatus including a plurality of pattern generating means each for separately generating said pattern of bits for a respective one of said terminals, each said pattern generating means comprising pattern generator storage means for storing a plurality of basic pattern, and repetition control means for reading out said basic patterns, combinations of said basic patterns and sequences of said combinations of said basic patterns in order to obtain said serial pattern of bits, said repetition control means including address means for generating an address to said pattern generator storage means for reading out a pattern memory word stored at said address, said pattern memory word including at least one of said basic patterns and said pattern memory word further including control data for controlling the combinations and repetitions of basic patterns to be read out of said pattern generator storage means, and said repetition control means further comprising logic means responsive to said control data for controlling said address means to provide a desired sequence of addresses to said pattern generator storage means.

2. An apparatus for testing an array having a plurality of terminals, said apparatus testing said array by applying a sequence of test vectors to said array terminals with each said test vector including a plurality of bits each of which is applied to a respective one of said array terminals, each terminal receiving a serial pattern of bits as its respective portion of said sequence of vectors, said apparatus including a plurality of pattern generating means each for separately generating said pattern of bits for a respective one of said terminals, each said pattern generating means comprising pattern generator storage means for storing at least one basic pattern, and repetition control means for reading said basic pattern out of said pattern generator storage means a predetermined number of times to obtain said serial pattern of bits, said apparatus further comprising data output means responsive to the output of said pattern generator storage means for generating an output signal in N-bit parallel from representing said serial pattern of bits, and parallel-to-serial conversion means responsive to said N-bit parallel output signal for applying said serial bit pattern to a respective one of said array terminals.

3. A testing apparatus as defined in claim 2, wherein N is a number less than the number of bits in the output from said pattern generator storage means.

4. A testing apparatus as defined in claim 2, wherein the response of said array is monitored by receiving response data from a portion of said plurality of pins and comparing said response data to expected data, each said pattern generating means including control latch means for providing an output indicating that its respective pattern generating means is to act as a receiver, said output means being responsive to said output from said control latch means for providing data from said pattern generator storage means as said expected data.

5. An apparatus for testing an array having a plurality of terminals, said apparatus testing said array by applying a sequence of testing vectors to said array terminals with each test vector including a plurality of bits each of which is applied to a respective one of said array terminals, each terminal receiving a serial pattern of bits as its respective portion of said sequence of vectors, and the response of said array being monitored by receiving response data from a portion of said plurality of pins and comparing said response data to expected data, said apparatus including:
a plurality of pattern generating means, each responsive to a respective pattern generating program for separately generating said pattern of bits for a respective one of said terminals, each said pattern generating means comprising pattern generator storage means for storing at least one basic pattern, and repetition control means for reading said basic pattern out of said pattern generator storage means a predetermined number of times to obtain said serial pattern of bits, each said pattern generating means including control latch means for providing an output indicating that its respective pattern generating means is to act as a receiver;
data output means responsive to the output of said pattern generator storage means for generating an output signal in N-bit parallel form representing said serial pattern of bits, said output means being responsive to said output from said control latch means for providing data from said pattern generator storage means as said expected data; and
parallel-to-serial conversion means responsive to said N-bit parallel output signal for applying said serial bit pattern to a respective one of said array terminals;

comparison means for receiving said response data, expected data and mask data and for providing error output data, wherein said response data and said expected data are compared with one another in accordance with mask data, said output means being responsive to said output signal from said control latch means for providing a portion of the output from said pattern generator storage means to said comparison means as said mask data.

6. A testing apparatus as defined in claim 5, said comparison means further providing error data and an error flag signal when an error is detected between said response and expected data, said pattern generating means further comprising error memory means responsive to said error load output signal and said error data for storing said error data.

7. A testing apparatus as defined in claim 6, wherein said comparison means receives said response data in N-bit parallel form during successive periods of time and compares said response data to said expected data to generate a comparison signal during each of said successive periods of time, said comparison means including comparison storage means for storing at least two consecutive comparison signals, and each of said error data signals including at least two comparison signals, said error flag output signal being provided for a duration corresponding to a plurality of successive error data signals, said pattern generating means further including counter means for providing a count output indicating the portion of the error flag output in which an error was detected, said comparison storage means storing said counter means output together with the associated comparison signal.

8. A testing apparatus as defined in claim 7, further comprising means for generating program step signals indicating respective steps in said testing program, and error flag storage means for storing said error flag output signals together with a program step signal indicating the program step in which an error occurred.

9. A testing apparatus as claimed in claim 8, further comprising means for counting said error flag output signals and for providing its count output as an address to said error flag storage means for controlling the location at which said error flags are stored.

10. A testing apparatus as defined in claim 9, further comprising maximum error register means for storing a value indicating a maximum number of failed cycles during a test program, comparator means for comparing said maximum number value to the value in said counter and for providing an output when said counter value indicates that said maximum number of failed cycles has been reached, and means responsive to the output of said comparator for interrupting said testing operation.

11. An apparatus for testing an array having a plurality of terminals, said apparatus testing said array by applying a sequence of test vectors to said array terminals with each said test vector including a plurality of bits each of which is applied to a respective one of said array terminals, each terminal receiving a serial pattern of bits as its respective portion of said sequence of vectors, said apparatus including:

a plurality of pattern generating means, each responsive to a respective pattern generating program for separately generating said pattern of bits for a respective one of said terminals, each said pattern generating means comprising pattern generator storage means for storing at least one basic pattern, and repetition control means for reading said basic pattern out of pattern geneator storage means a predetermined number of times to obtain said serial pattern of bits, said pattern generating means reading out said basic pattern from said pattern generator storage means a predetermined number of times by performing a subroutine in which a predetermined sequence of addresses are provided to said pattern generator storage means, each said subroutine commencing at a respective starting address;

controller means for providing a sequence of said starting addresses to each said pattern generating means, said controller means comprising a controller memory for storing a plurality of words at respective addresses, each said word including repeat control data and pin address data, controller addressing means for providing addresses to said controller memory means for selectively reding said words out of said controllr memory means, controller logic means responsive to the repeat control data portion of each output from said controller memory means for controlling the sequence of addresses provided to said controller memory means from said controller addressing means, and pin address generator means responsive to said pin address data portion of each output word from said controller memory means and also responsive to output signal from said controller logic means for generating said starting addresses for each of said pattern generating means.

12. A testing apparatus as defined in claim 11, wherein said controller logic means provides an output signal representing the present stage in a repetition sequence and said pin address generating means comprises arithmetic means for performing an arithmetic operation defined by said pin address data on data represented by said output signal from said controller logic means.

13. A testing apparatus as defined in claim 11, wherein said logic means responds to said control data portion output from said controller memory means for cycling said memory addresses through a plurality of loops, said controller logic means output signal representing the status of respective ones of said loops.

14. A pattern generator for use in a memory tester for testing a memory under test having a plurality of pins, said memory tester being of the type including a pattern generator for generating a sequence of patterns and means for connecting said patterns to said plurality of pins, said pattern generator comprising:

a programmable controller for generating a first sequence of starting addresses; and a plurality of pin pattern generators each responsive to one starting address for each generating plurality of pattern portions for application to a respective one of said plurality of pins.

15. A pattern generator as defined in claim 14, wherein each of said pin pattern generators comprises:

means for storing at least one basic bit pattern;

means for storing control data representing repetition information; and means for reading said at least one basic bit pattern out of said means for storing a predetermined number of times in accordance with said repetition information.

16. An apparatus for testing an array having a plurality of terminals, said apparatus testing said array by applying a sequence of input test vectors to said array terminals and monitoring the response of said array, said apparatus including a plurality of pattern generating means each responsive to a respective pattern generating program for generating a sequence of test signals to be applied to a respective one of said array terminals, each pattern generating means including pattern generator storage means for storing pattern data and programmed means responsive to a respective program for generating its respective sequence of test signals, each said programmed means including program storage means for storing said pattern generating program, and means responsive to said pattern generating program for reading a desired sequence of data out of said pattern generator storage means, said pattern generator storage means and said program storage means comprising a single memory addressed by common address means.

17. A testing apparatus as defined in claim 16, wherein said single address means comprises logic means responsive to program data read out of said program storage means for generating an address to said single memory.

18. A testing apparatus as defined in claim 16, wherein each said pattern generator storage means stores at least one basic pattern, and said programmed means is responsive to said respective pattern generating program for reading said basic pattern out of said pattern generator storage means a predetermined number of times to obtain said sequence of test signals.

19. A testing apparatus as defined in claim 18, wherein said pattern generator storage means stores a plurality of basic patterns and said programmed means reads out said basic patterns, combinations of said basic patterns and sequences of said combinations of said basic patterns in order to obtain said sequence of test signals.

* * * * *